(12) United States Patent
Bergendahl et al.

(10) Patent No.: US 10,566,414 B2
(45) Date of Patent: Feb. 18, 2020

(54) BEOL CAPACITOR THROUGH AIRGAP METALLIZATION

(71) Applicant: International Business Machines Corporation, Armonk, NY (US)

(72) Inventors: Marc A. Bergendahl, Troy, NY (US); James J. Demarest, Rensselaer, NY (US); Christopher J. Penny, Saratoga Springs, NY (US); Christopher Waskiewicz, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/254,582

(22) Filed: Sep. 1, 2016

(65) Prior Publication Data
US 2018/0061933 A1  Mar. 1, 2018

(51) Int. Cl.
*H01L 49/02* (2006.01)
(52) U.S. Cl.
CPC .............. *H01L 28/60* (2013.01); *H01L 28/90* (2013.01); *H01L 28/92* (2013.01)
(58) Field of Classification Search
CPC ... H01L 28/40; H01L 28/82; H01L 28/86–92; H01L 28/60; H01L 28/90; H01L 28/92
See application file for complete search history.

(56) References Cited

U.S. PATENT DOCUMENTS

| 6,452,251 B1* | 9/2002 | Bernstein ............. H01L 23/5223 257/301 |
| 6,780,727 B2 | 8/2004 | Hwei |
| 6,946,381 B2 | 9/2005 | Hwang |
| 6,972,451 B2* | 12/2005 | Delpech .............. H01L 23/5223 257/304 |
| 7,091,541 B2 | 8/2006 | Natsume et al. |

(Continued)

FOREIGN PATENT DOCUMENTS

| CN | 101533838 B | 9/2010 |
| JP | 57078017 A | 5/1982 |
| JP | 06252420 A | 9/1994 |

*Primary Examiner* — Jose R Diaz
(74) *Attorney, Agent, or Firm* — Harrington & Smith (57) ABSTRACT

A backend-of-the-line (BEOL) semiconductor capacitor made by method, apparatus, or computer program product, through an airgap metallization process, patterning a first electrode by removing a portion of inter-layer dielectric for a desired capacitor area, depositing a dielectric for a capacitor insulator, filling the desired capacitor area to form a second electrode, polishing and capping the second electrode, and interconnecting the first electrode and the second electrode. The manufactured product has a bottom electrode, composed of a conductor, electrically connected to upward conductive prominences; a low-K layer, above and conjoined to the bottom layer and surrounding the prominences, composed of a low-K dielectric; an isolation layer, above the low-K layer and surrounding the prominences, composed of a high-K insulator material, where modulating its material and thickness controls the capacitance; and a top electrode, composed of a conductor and electrically connected to downward prominences, where the bottom and top electrodes are interconnected.

9 Claims, 11 Drawing Sheets

(56) References Cited

U.S. PATENT DOCUMENTS

| | | | |
|---|---|---|---|
| 7,180,117 B2* | 2/2007 | Won | H01L 23/5223 |
| | | | 257/296 |
| 8,053,865 B2 | 11/2011 | Chang et al. | |
| 8,519,510 B2 | 8/2013 | Doyle et al. | |
| 8,980,708 B2 | 3/2015 | Zhu et al. | |
| 2006/0197183 A1 | 9/2006 | Yang | |
| 2009/0224359 A1 | 9/2009 | Chang et al. | |
| 2013/0075862 A1* | 3/2013 | Rennie | H01L 23/5223 |
| | | | 257/532 |
| 2015/0236084 A1 | 8/2015 | Park et al. | |

* cited by examiner

BEOL CAPACITOR THROUGH AIRGAP METALLIZATION

TECHNICAL FIELD

This invention relates generally to back end of the line (BEOL) semiconductor integrated circuits, and more particularly, to capacitors produced therein formed by metallizing an airgap and then merging with a plate or line at the next level to create a capacitor with a high capacitance and high density.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

With the current trends in integrated circuit (IC) miniaturization, and increasingly smaller critical dimensions, it is desirable in semiconductor device technology to integrate many different functions on a single chip.

The back end of line (BEOL) is the second portion of IC fabrication where the individual devices (transistors, capacitors, resistors, etc.) get interconnected with wiring on the wafer, the metallization layer. Common metals are Copper interconnect and Aluminum interconnect. BEOL generally begins when the first layer of metal is deposited on the wafer. BEOL includes contacts, insulating layers (dielectrics), metal levels, and bonding sites for chip-to-package connections.

Capacitors come in different varierties. Air capacitors are capacitors which use air as their dielectric. The simplest air capacitors are made of two conductive plates separated by an airgap. Air capacitors can be made in a variable or fixed capacitance form.

Metal-insulator-metal (MIM) capacitors, which are well suited for use in these integrated circuits, is a particular type of capacitor having two metal plates disposed around a capacitor dielectric. They are rather large in size, being several hundred micrometers wide (i.e., depending on the capacitance, which is much larger than a transistor or memory cell, for example). MIM capacitors are typically used for example as decoupling capacitors for microprocessors, radio-frequency (RF) capacitors in high frequency circuits, and filter and analog capacitors in mixed-signal products. MIM capacitors are playing an important role in implementation of new integrated circuit designs, and improvements in MIM capacitors continue.

The current invention moves beyond these techniques and materials.

Abbreviations that may be found in the specification and/or the drawing figures are defined below:
3-D three-dimensional
BEOL back end of the line
CMP chemical metal process
Cu copper
CVD chemical vapor deposition
IC integrated circuit
ILD inter-layer dielectric
K dielectric constant
MIM metal-insulator-metal
POR process of record
RF radio frequency
SiCO silicon oxycarbide
Ta tantalum
TaN tantalum nitride
Abbreviations not listed above would retain their meaning based on the context herein and the art discussed.

BRIEF SUMMARY

This section is intended to include examples and is not intended to be limiting.

In one exemplary aspect, a method for making a BEOL capacitor through airgap metallization comprises patterning a first array for a first electrode in a semiconductor capacitor, removing a portion of inter-layer dielectric to achieve a desired capacitor area, depositing a dielectric for a capacitor insulator, filling the desired capacitor area to form a second electrode, polishing and capping the second electrode, and interconnecting the first electrode and the second electrode.

In another exemplary aspect, a computer program product embodied on a non-transitory computer-readable medium in which a computer program is stored that, when being executed by a computer, is configured to provide instructions to control or carry out a method for making a BEOL capacitor through airgap metallization comprising patterning a first array for a first electrode in a semiconductor capacitor, removing a portion of inter-layer dielectric to achieve a desired capacitor area, depositing a dielectric for a capacitor insulator, filling the desired capacitor area to form a second electrode, polishing and capping the second electrode, and interconnecting the first electrode and the second electrode In another exemplary aspect, an apparatus comprising at least one processor and at least one memory including computer program code, wherein the at least one processor, in response to execution of the computer program code, is configured to cause the apparatus to perform at least the following to make a BEOL capacitor through airgap metallization: patterning a first array for a first electrode in a semiconductor capacitor; removing a portion of inter-layer dielectric to achieve a desired capacitor area; depositing a dielectric for a capacitor insulator; filling the desired capacitor area to form a second electrode; polishing and capping the second electrode; and interconnecting the first electrode and the second electrode.

In another exemplary aspect, an apparatus comprising means to perform at least the following: patterning a first array for a first electrode in a semiconductor capacitor; removing a portion of inter-layer dielectric to achieve a desired capacitor area; depositing a dielectric for a capacitor insulator; filling the desired capacitor area to form a second electrode; polishing and capping the second electrode; and interconnecting the first electrode and the second electrode.

In another exemplary aspect, an article for use in the manufacture of a BEOL capacitor through airgap metallization comprises: a substrate comprising a semiconductor material; a first array for a first electrode patterned in a semiconductor capacitor process; a desired capacitor area made by removing a portion of inter-layer dielectric; a capacitor insulator made by depositing a dielectric; a second electrode formed by filling the desired capacitor area, the second electrode is polished and capped; and an interconnection of the first electrode and the second electrode.

In another exemplary aspect, an article for use in the manufacture of a BEOL capacitor through airgap metallization comprises: a substrate comprising a semiconductor material; a bottom layer, comprising a lower plate or a bottom electrode of the capacitor, composed of a conductor, electrically connected to upward prominences composed of the conductor or another conductor; a low-K layer, above and conjoined to the bottom layer and surrounding the prominences to a specified height, composed of an oxide or a low-K dielectric, where the low-K dielectric has dielectric constant less than silicon dioxide; an isolation layer, above the low-K layer and surrounding the prominences above the specified height, composed of a high-K insulator material, where the insulator has a dielectric constant higher than silicon dioxide, where the material and thickness of the isolation layer can be modulated to control the capacitance; and a cap, comprising an upper plate or a top electrode of the capacitor, composed of a second conductor, electrically connected to downward prominences composed of the second conductor or a second other conductor, where the second conductor can be composed of the conductor and the second other conductor can be composed of the other conductor, where the cap and the downward prominences are isolated from the bottom layer by at least the isolation layer, where the bottom layer and the cap are interconnected.

BRIEF DESCRIPTION OF THE DRAWINGS

In the attached Drawing Figures.

Note that any discussion of "stages" are merely convenient points of discussion and may not describe other aspects or steps taking place known in the art.

DETAILED DESCRIPTION OF THE DRAWINGS

In order to overcome some of the disadvantages of the current state of affairs, exemplary embodiments of the current invention look to metallize an airgap and then merge with a plate or line at the next level to create a capacitor with a high capacitance and high density.

The word "exemplary" as used herein means "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Therefore, the exemplary embodiments herein describe techniques for creating these back end of the line capacitors in integrated circuit/semiconductor chips. Additional description of these techniques is presented as well as embodiments that describe the final structure of these capacitors.

Without in any way limiting the scope, interpretation, or application of the claims appearing below, an advantage or technical effect of one or more of the example embodiments disclosed herein is to provide a method and structure with a high capacitance density. Another technical effect of one or more of the example embodiments disclosed herein is that this invention provides a solution wherein the capacitor can be placed in a metal level close to the devices.

In order to create a capacitor with a high capacitance and high density, a BEOL capacitor can be formed by metallizing an airgap and then merging with a plate or line at the next level.

Previous works may describe similar capacitor structure; however, these similar structures have several drawbacks that are improved by the current invention. First, the need to fill both levels of metal can lead to challenges because of the high aspect ratio. There is also little control of the dielectric material separating the combs, so the capacitance cannot be tuned as finely.

Our invention provides a novel structure and method for increasing capacitance density in a BEOL structure. Current methods require multiple lithography steps to generate multiple electrodes, thus increasing cost. Alternately, the capacitor is formed in a dielectric trench to increase density, but that requires conformal deposition of the lower electrode. By utilizing an airgap formed in the bottom metal level to create a high density capacitor, embodiments of the current invention provide a novel method of a BEOL MIM capacitor formed within the airgap between metal lines of the prior metal level and a method to create such capacitor by forming an airgap between the first electrodes, and depositing an insulating dielectric, and depositing the second electrode.

Embodiments of the current invention also provide a novel structure where MIM capacitor is formed between some BEOL interconnect wires as a first electrode while an airgap is retained between other BEOL interconnect wires.

Advantages of using the current invention instead of known solutions include the feature that after creating an airgap in a metal level, an isolation layer can be applied. Modulating the material and/or thickness of this isolation layer allows the total capacitance of the structure to be controlled. Then the resulting trenches are filled with copper. A subsequent metal level is built to contact these lines and form a high-density capacitor between the airgap formed trenches and the original trenches where the capacitance can be controlled.

In comparison, prior solutions do not accomplish these ends nor teach the methods or structures disclosed herein. For example, U.S. Pat. No. 8,053,865 B2/US 2009/0224359 A1/CN 101533838B discusses structures combining airgaps and capacitors. The airgaps are used to tune or control the capacitance in the capacitor region or in the non-capacitor region. In the final structure, any airgaps within the capacitor region would remain. In contrast, the current invention teaches a structure and method to utilize the airgaps for topography to increase the capacity density of the capacitor. In our invention, any airgaps within the capacitor region would be filled to create the upper electrode of the capacitor.

Likewise, U.S. Pat. No. 8,980,708 B2 does not cover the current invention utilization of filling airgaps to create high-density capacitors. Rather, it merely discusses a general method and structure for creating capacitors in semiconductor devices.

JP 06252420A discusses the use of airgap capacitors (capacitors with the dielectric material being an airgap or void) for use in pressure monitoring. In contrast, the current invention does not utilize an airgap capacitor similar to the one described. In our invention, the airgap is used as a method to induce topography and increase the capacitance density. The reference also does not relate to semiconductor manufacturing techniques.

JP 57078017A is another reference that uses airgap capacitors (capacitors with the dielectric material being an airgap or void), in this instance for use in light modulation. The spacing in the airgap capacitors is controlled by semiconductor devices. However, this reference does not relate to semiconductor manufacturing techniques. And again, the current invention does not utilize an airgap capacitor similar to the one described in this reference. In our invention, the airgap is used as a method to induce topography and increase the capacitance density.

Thus, none of these references creates an airgap in a metal level as done with the current invention where an isolation layer can be applied such that modulating the material and/or thickness of this isolation layer allows the total capacitance of the structure to be controlled.

Capacitance requirements for BEOL applications in the advanced nodes are exceeding the capacitance density available from conventional MIM capacitor designs.

One current solution to increase capacitance density is to build a multi plate capacitor. This solution, however, increases the cost and complexity of the process flow with additional process steps and more lithography masks.

Our invention is to utilize an airgap process to remove the dielectric between metal lines and create an interdigitated capacitor that has higher density than current planar capacitors.

The current art includes many structures for non-planar capacitors, but the structure for these capacitors is formed in an insulating material before the first electrode is applied.

Our invention creates the first electrode through a standard damascene process and then removes the dielectric to allow higher capacitance density through the topography generated.

As an overview of the process involves the following:

A first array of Cu Lines (first/Lower Electrode) Level "N" is patterned using an Existing/POR BEOL process, applicable to any BEOL level;

Next, a portion of the ILD is removed from between desired capacitor area;

A dielectric for capacitor is then deposited. Existing high-K materials/CVD processes can be used for film deposition;

Next, the capacitor area is filled with a copper to form a second/top electrode and polished and capped; and Pattern N+1 to provide interconnect to first and second electrode. Existing BEOL processes used, applicable to any BEOL level.

Copper is the primary embodiment for the electrodes but other metals could be used.

For a more detailed discussion, we turn now to the Figures representing the finished structure and the various stages of the method to get to that finished structure.

Figure 1:
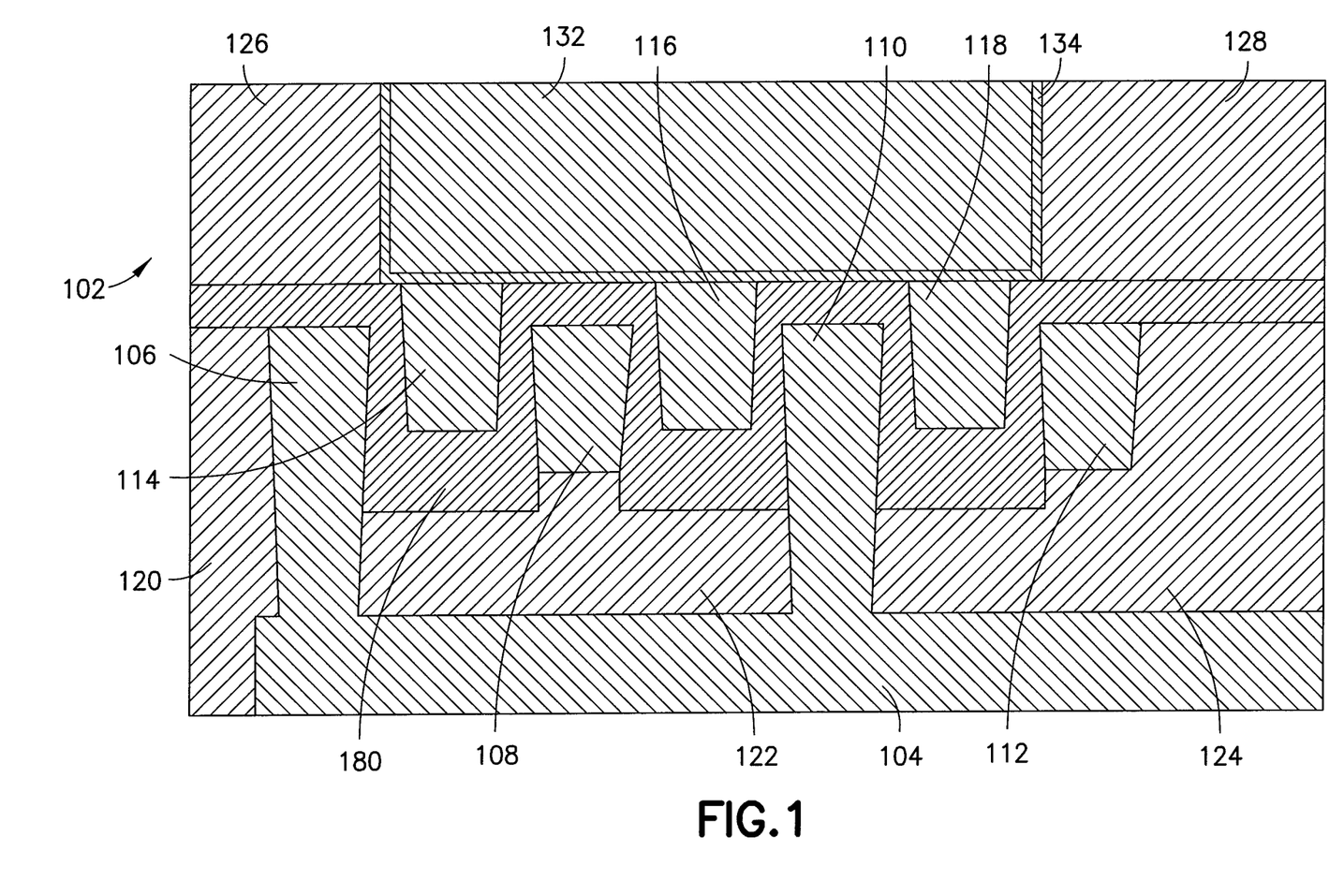
FIG. 1 is a cross-sectional view of an exemplary embodiment of a BEOL capacitor created through airgap metallization technique described herein.

Turning to FIG. 1, a block diagram representation is depicted of an example of a physical embodiment of a proposed final structure of a capacitor produced by the proposed methods described herein. The structure of the capacitor is shown cross-section where the various layers are shown in the top of the capacitor at the top of the Figure to the bottom of the capacitor at the bottom of the Figure.

The various materials of the layers are described in the key on the Figure where layer 104 composed of copper or some other conductor and where aspects 106, 108, 110, and 112 also all made of copper or another conductor are all electrically tied together such that if the Figure were displayed top-down 3-D these various prominences would be in some circular, spiral, or other shaped configuration that would connect them all electrically.

Volumes 120, 122, 124, 126, and 128 are composed of an oxide or a low-K dielectric. In semiconductor manufacturing, a low-K is a material with a small dielectric constant relative to silicon dioxide. Although the proper symbol for the dielectric constant is the Greek letter κ (kappa), in conversation such materials are referred to as being "low-k" (low-kay) rather than "low-κ" (low-kappa). Low-K dielectric material implementation is one of several strategies used to allow continued scaling of microelectronic devices, colloquially referred to as extending Moore's law. In digital circuits, insulating dielectrics separate the conducting parts (wire interconnects and transistors) from one another. As components have scaled and transistors have gotten closer together, the insulating dielectrics have thinned to the point where charge builds up and crosstalk adversely affects the performance of the device. Replacing the silicon dioxide with a low-K dielectric of the same thickness reduces parasitic capacitance, enabling faster switching speeds and lower heat dissipation.

Volume 180 is the high-K insulator used for the capacitor. The term high-K dielectric refers to a material with a high dielectric constant κ (as compared to silicon dioxide). High-K dielectrics are used in semiconductor manufacturing processes where they are usually used to replace a silicon dioxide gate dielectric or another dielectric layer of a device. The implementation of high-K gate dielectrics is one of several strategies developed to allow further miniaturization of microelectronic components, colloquially referred to as extending Moore's Law. In this instance, this is the material which fills the airgap (described below). As such, this isolation material and thickness of it can be modulated to control the capacitance.

Typical cap structure of volume 132 comprises the upper plate or top electrode of the capacitor and is tied electrically to prominences 114, 116, and 118. Again, volumes 126 and 128 provide insulation.

The result of these layers is a capacitor with a copper or other conductor on top and on the bottom but with a high-K insulator for the capacitor in volume 180 where the capacitance can be varied depending on the density or material used in volume 180 with the ability to create a high density of capacitance. Note that prominences 114, 116, and 118 composed of copper (or similar) completely contact material 180, such that no airgaps exist.

Feature 134 serves as the liner between the copper (or other conductor) and the dielectric and in the embodiment shown herein composed of tantalum, tantalum nitride, tantalum nitride, or some other similar compound which could be used as a liner.

FIGS. 2 through 9 are similar to FIG. 1 in that they depict block diagram representations of an example of a physical embodiment of stages to produce embodiments of the proposed capacitor. Again, the structure of the capacitor is shown in cross-section for each of these stages where the various layers are shown in the top of the capacitor at the top of the Figure to the bottom of the capacitor at the bottom of the Figure.

Figure 2:
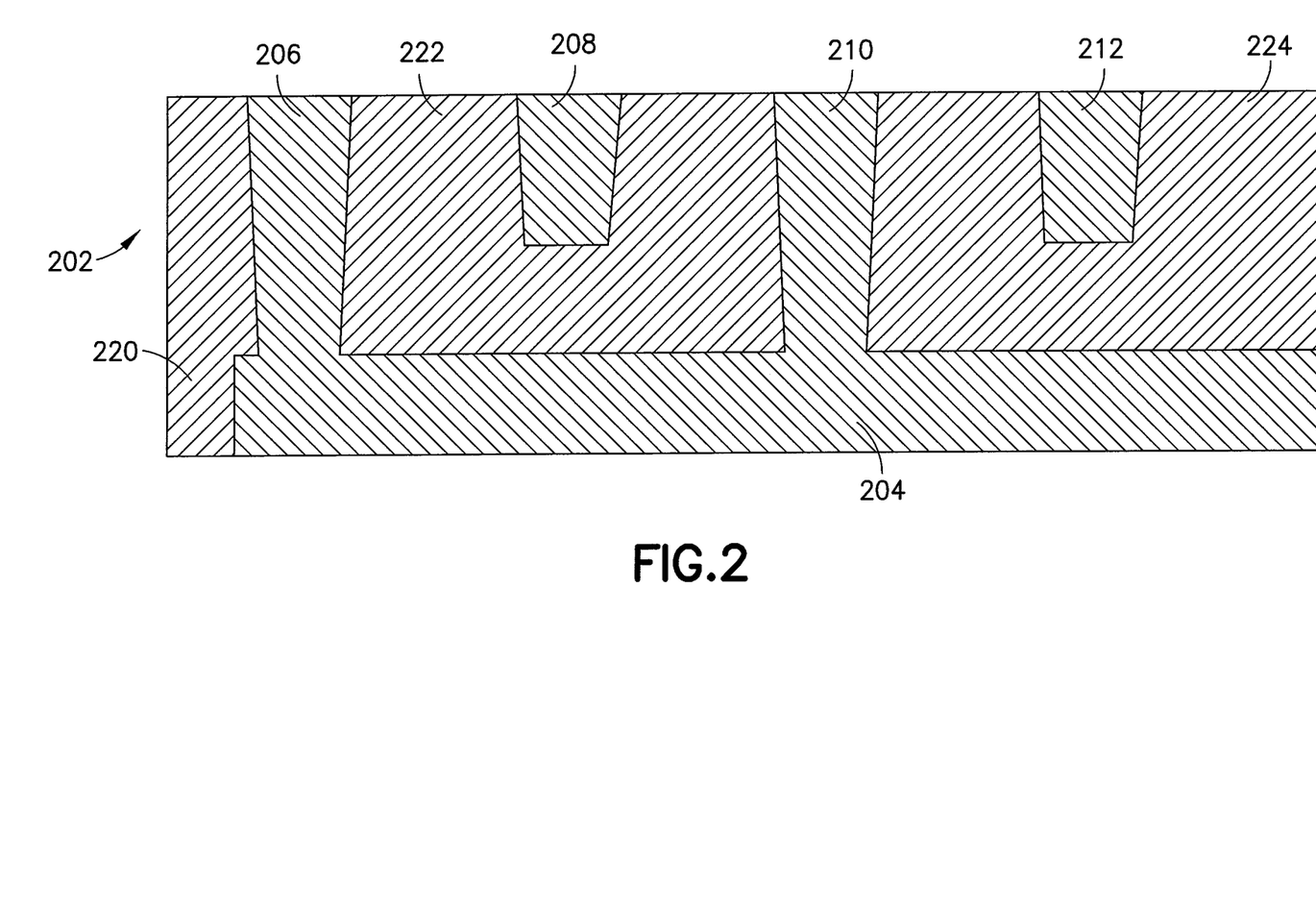
FIG. 2 is a cross-sectional view of the BEOL capacitor created through airgap metallization technique described herein during an initial stage of manufacture post metallization and CMP.

Turning to FIG. 2 which represents the post metallization and Chemical Metal Process (CMP) stage of production, after a typical BEOL build where an integrated circuit chip is etched and the holes are filled with copper and then after filling the copper is polished back down. Thus after this stage what remains is shown as item 202 which is simply composed of the etched base 204, composed of copper or some similar conductive material where prominences 206, 208, 210, and 212 would be connected in three dimensions volumes 220, 222, and 224 composed of an oxide are a low-K dielectric, for example, silicon dioxide or low-K SiCO which can be dense or porous; the dense having a higher K value and no copper. The copper or other conductive material could be some copper aluminum, copper magnesium, tungsten, cobalt or some other similar element or compound to create the desired integrated circuit.

Figure 3:
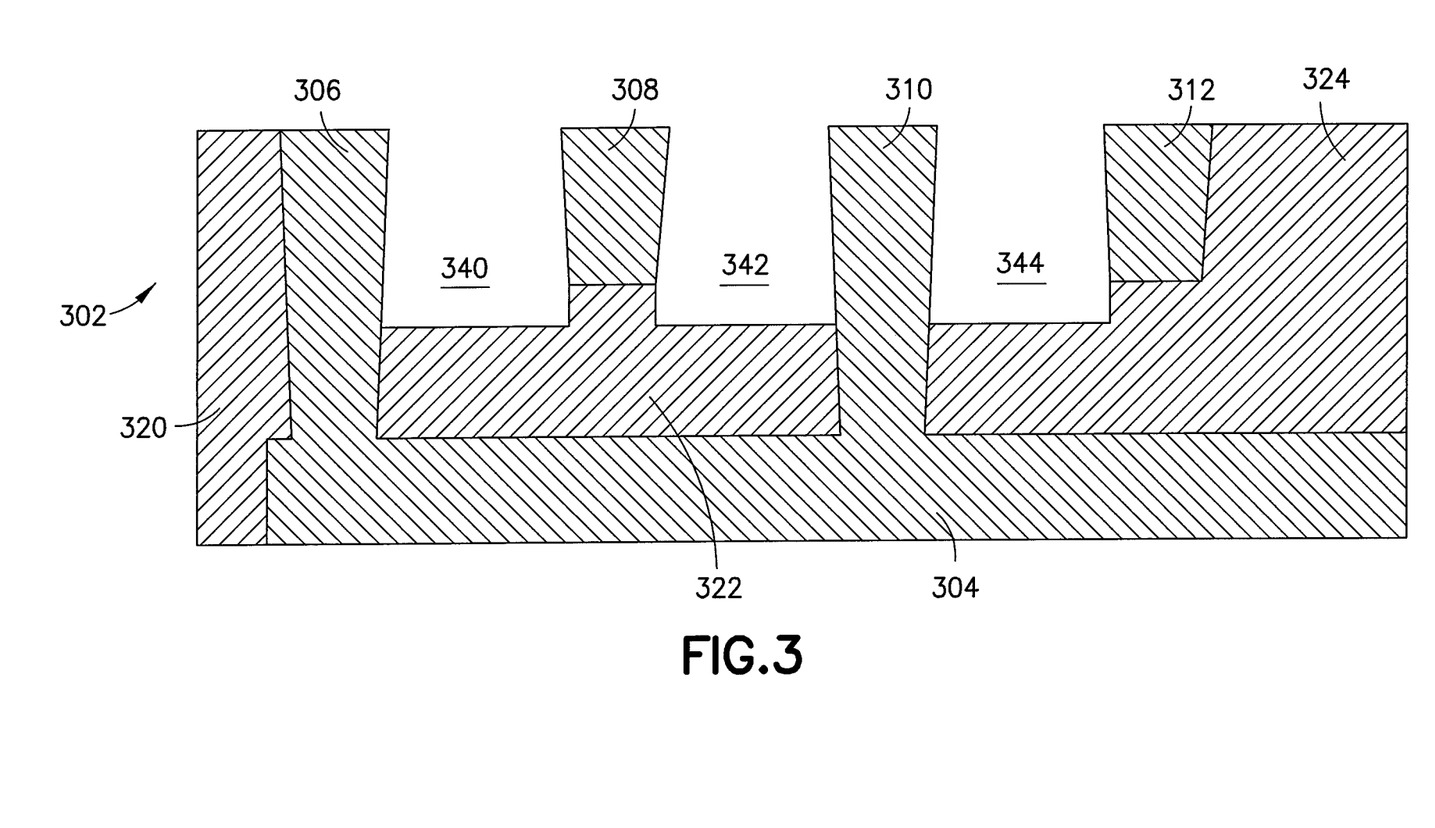
FIG. 3 is a cross-sectional view of the BEOL capacitor created through airgap metallization technique described herein during a second stage of manufacture post airgap.

FIG. 3 represents the stage where an airgap has already been created which can be done by a multitude of processes which may have been discussed in some of the references cited earlier herein. This phase can also be called the post airgap phase. As can be seen in comparison with FIG. 2 in FIG. 3 the post airgap phase is shown by item 302 where again items 304, 306, 308, 310, and 312 are all connected and composed of copper or other similar material. Volumes 320, 322, and 324 are composed of the oxide or low-K dielectric and, as can be seen from the presence of voids 340, 342, and 344, the airgap process (done by whatever means) has removed the oxide or low-K dielectric from volumes 316 and 318. The pattern that is created with voids 340, 342, 344 will later form an integral part of the capacitor and so the pattern that is created will need to be created in such a way as to serve the purposes of the capacitor, for example how thick the eventual capacitor material will be in order to create the correct capacitance.

Figure 4:
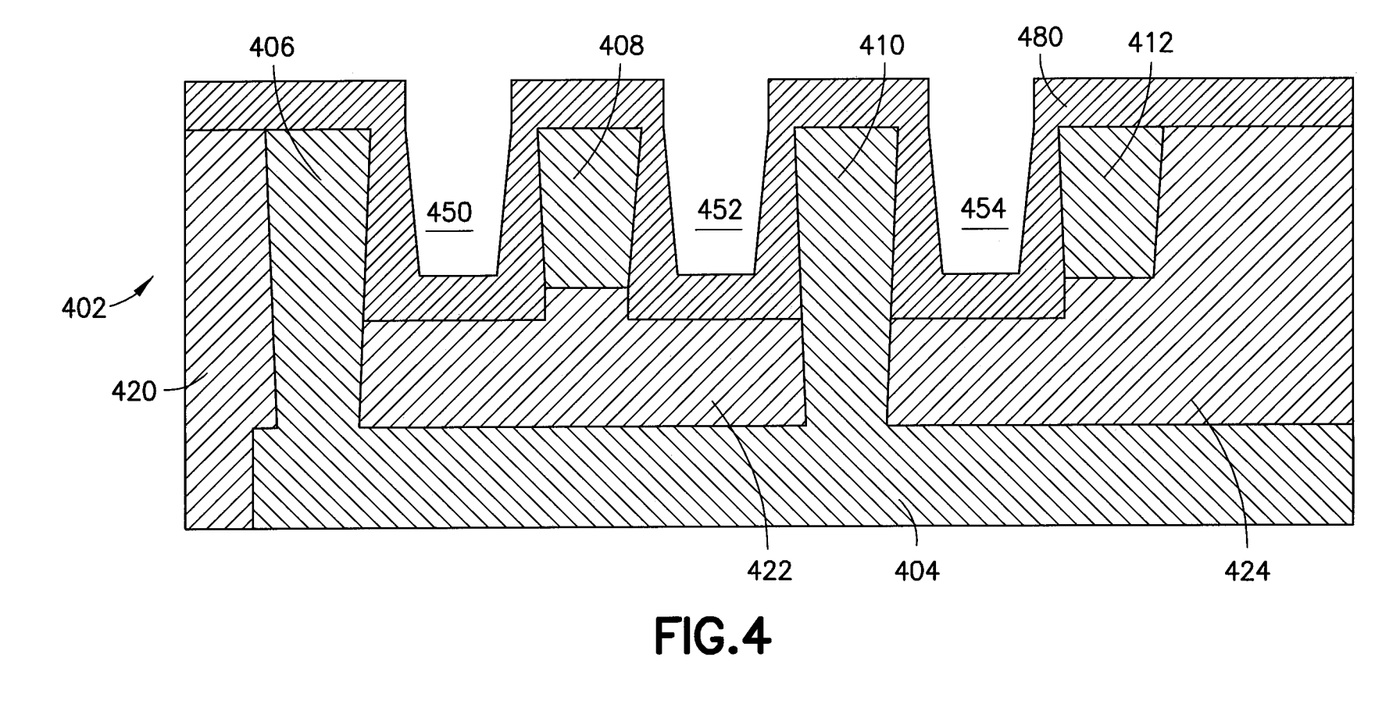
FIG. 4 is a cross-sectional view of the BEOL capacitor created through airgap metallization technique described herein during a third stage of manufacture post isolation layer deposition.

FIG. 4 shows the state of the capacitor in the post isolation layer deposition stage 402 where conductor 404 is connected with prominences 406, 408, 410, and 412 mirroring the structure shown in FIG. 3 and also with low-K dielectric material in volumes 420, 422, and 424. While the airgap process is not an easy one, after the typical airgap process material is put down that creates a void.

Figure 10:
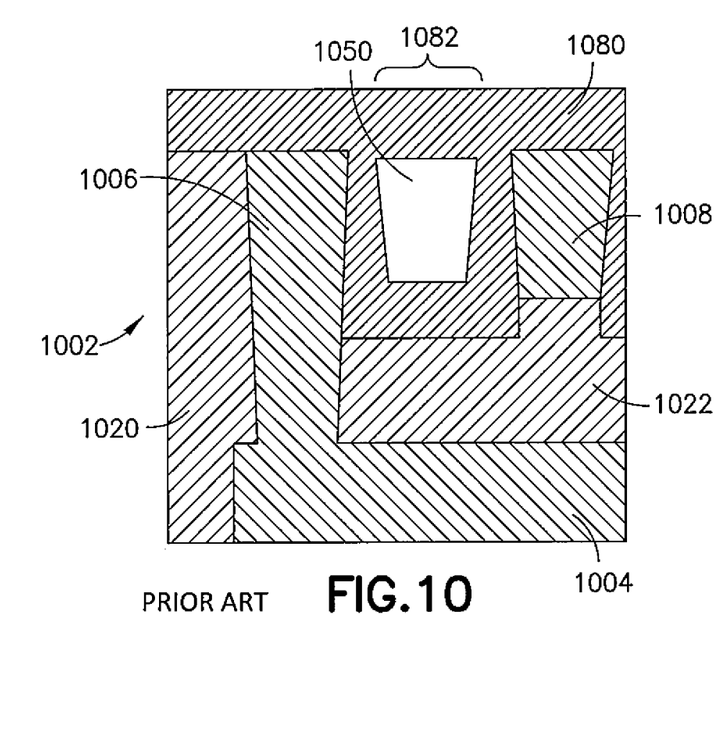
FIG. 10 is a partial cross-sectional view of the BEOL capacitor created with an airgap remaining instead of what is described in FIG. 4.

So as to not interrupt the sequence of Figures showing the steps in an exemplary process to create embodiments of the current invention, the previously known aspect of maintaining an airgap is shown in FIG. 10. Turning briefly to FIG. 10, the components shown in a post isolation layer deposition where airgap would be created in item 1002, shows low-K dielectric material 1020 and 1022 where part of material 1022 was removed by the airgap process and the layer deposition of the insulator material 1080; the material of 1080 which is identified as 1082 is actually a pinch off of the material over airgap 1050.

Returning now to FIG. 4, it can be seen that when the high-K insulator material 480 is deposited over what was item 302 to become item 402 voids 450, 452, and 454 exist but there is no corresponding material 480 above those voids. In other words, there is no correspondence to volume 1082 in item 402.

In contrast to the deposition of the high-K insulator in the past, the current invention has the high-K material deposited to conform to tops, sides, and bottoms of all the features and deposit evenly along all the surfaces. Examples of a high-K insulator could be for example a very thin layer of hafnium oxide or similar alloy.

Figure 5:
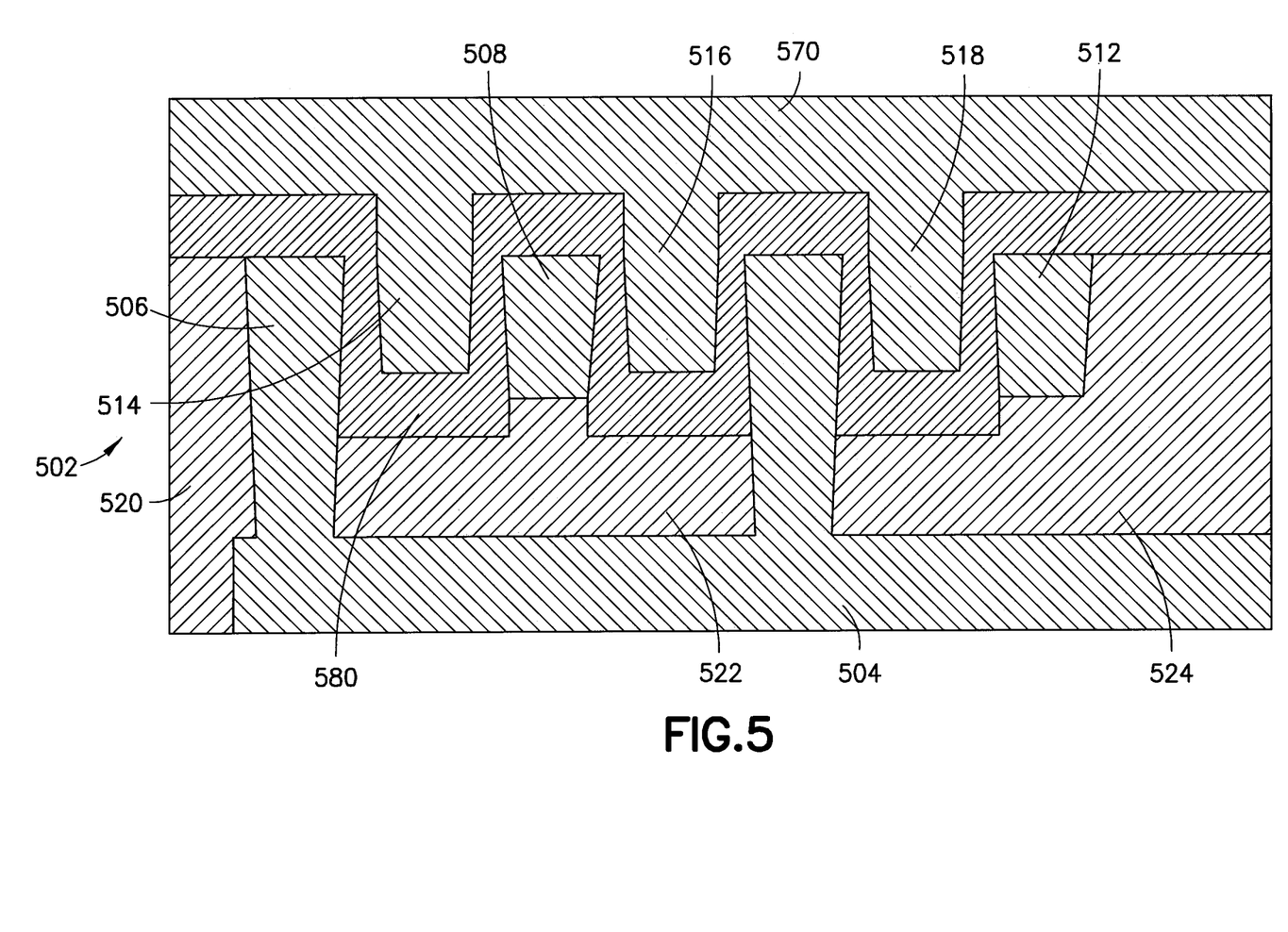
FIG. 5 is a cross-sectional view of the BEOL capacitor created through airgap metallization technique described herein during a fourth stage of manufacture post isolation layer deposition.

FIG. 5 is a representation of the process of forming embodiments of the capacitor herein, where item 502 shows the state of the process at the post top electrode fill stage. In item 502, there is again the bottom layer of copper 504 with oxides 520, 522, and 524. High-K insulator 580 is shown throughout 502 with top copper layer 570 laid down on top of high-K insulator 580 and prominences 514, 516, and 518 fill what would have been airgaps. The depositing of this upper layer of copper can be done by a standard damascene process but the act of filling in what would what would have been airgaps in the structure of having those airgaps filled has not previously been attempted or accomplished.

Figure 6:
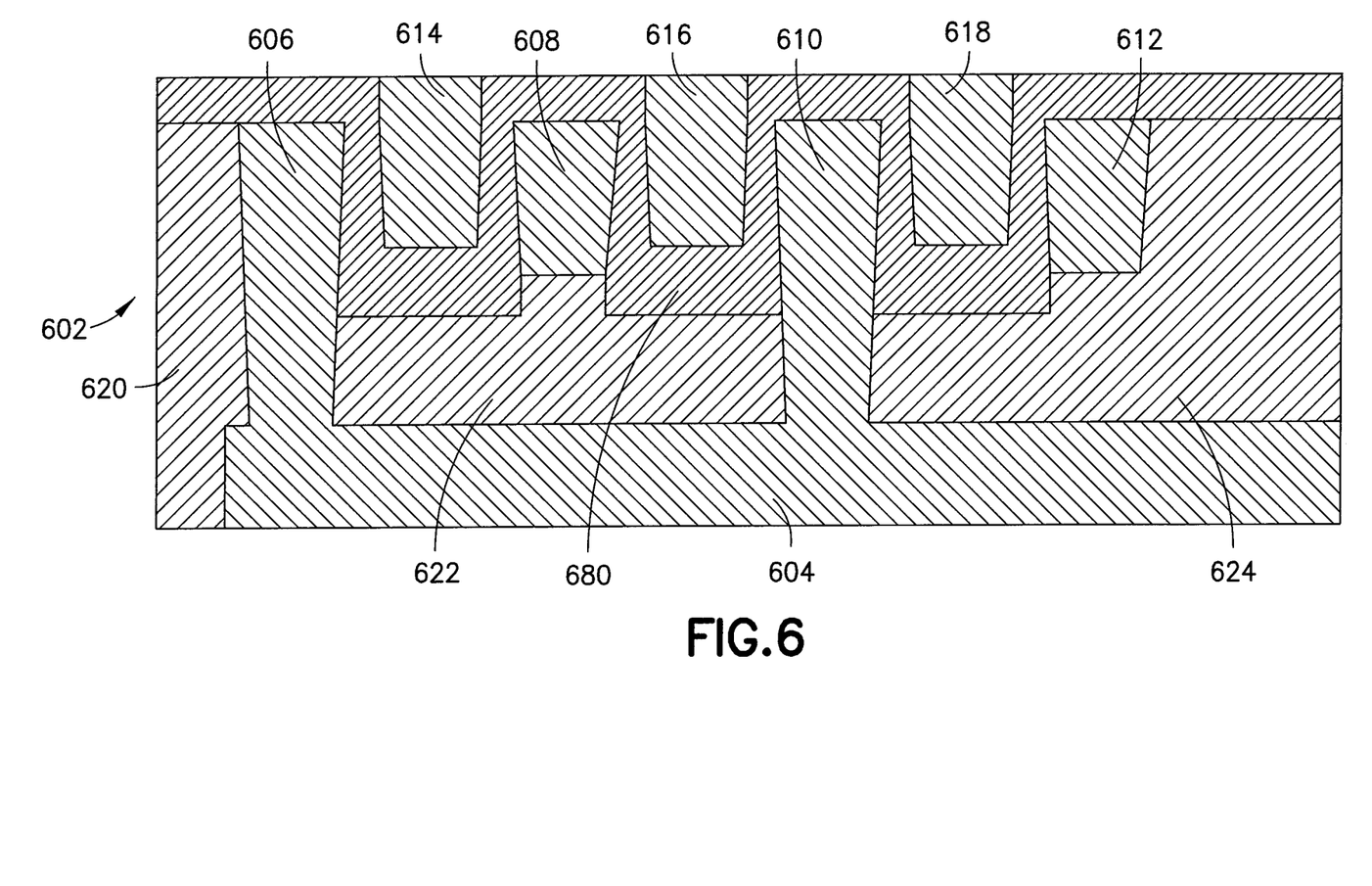
FIG. 6 is a cross-sectional view of the BEOL capacitor created through airgap metallization technique described herein during a fifth stage of manufacture post isolation layer deposition.

FIG. 6 is a representation of the post top electrode polish stage 602, where again bottom copper layer 604 has prominences 606, 608, 610, and 612 and volumes 620, 622 and 624 represent the low-K dielectric. High-K insulator 680 again runs the course of item 602 however the top part of the chip has been polished off such that the copper overburden is removed. Thus, referring back to FIG. 5, volume 570 has been polished away as has part of prominences 514, 516, and 518. This is done to remove the upper electrode in regions where there is no desire to have the capacitor form. As such, prominences 614, 616, and 618 may or may not be connected in any three-dimensional way.

Figure 7:
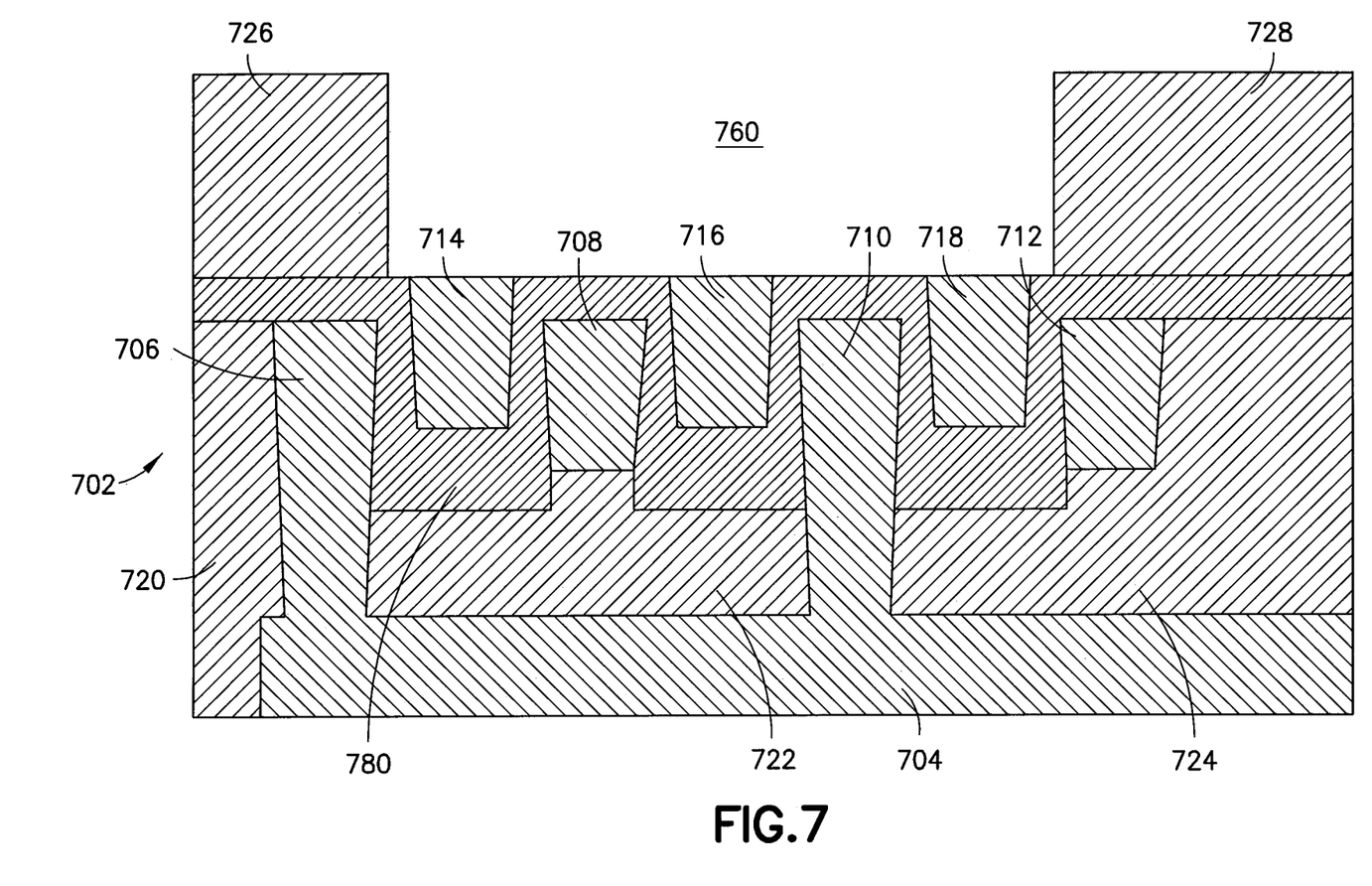
FIG. 7 is a cross-sectional view of the BEOL capacitor created through airgap metallization technique described herein during a sixth stage of manufacture post next level isolation layer deposition and trench patterning.

The next stage in the process is represented in FIG. 7 by item 702 which represents the post next level ILD deposition and, trench patterning stage. After the next level of ILD deposition, a patterning stack is applied using lithography to pattern it and etch it, thus exposing the region for the capacitor. Thus, low-K dielectric material 726 and 728 are laid down as one layer and then the pattern is cut out to expose void 760. Additional patterns in the next level ILD in regions outside the capacitor may or may not be present. These patterns may include wires or vias to connect to the previous levels.

Thus, copper prominences 714, 716, and 718 as well as a portion of high-K insulator material 780 are exposed to void 760.

Figure 8:
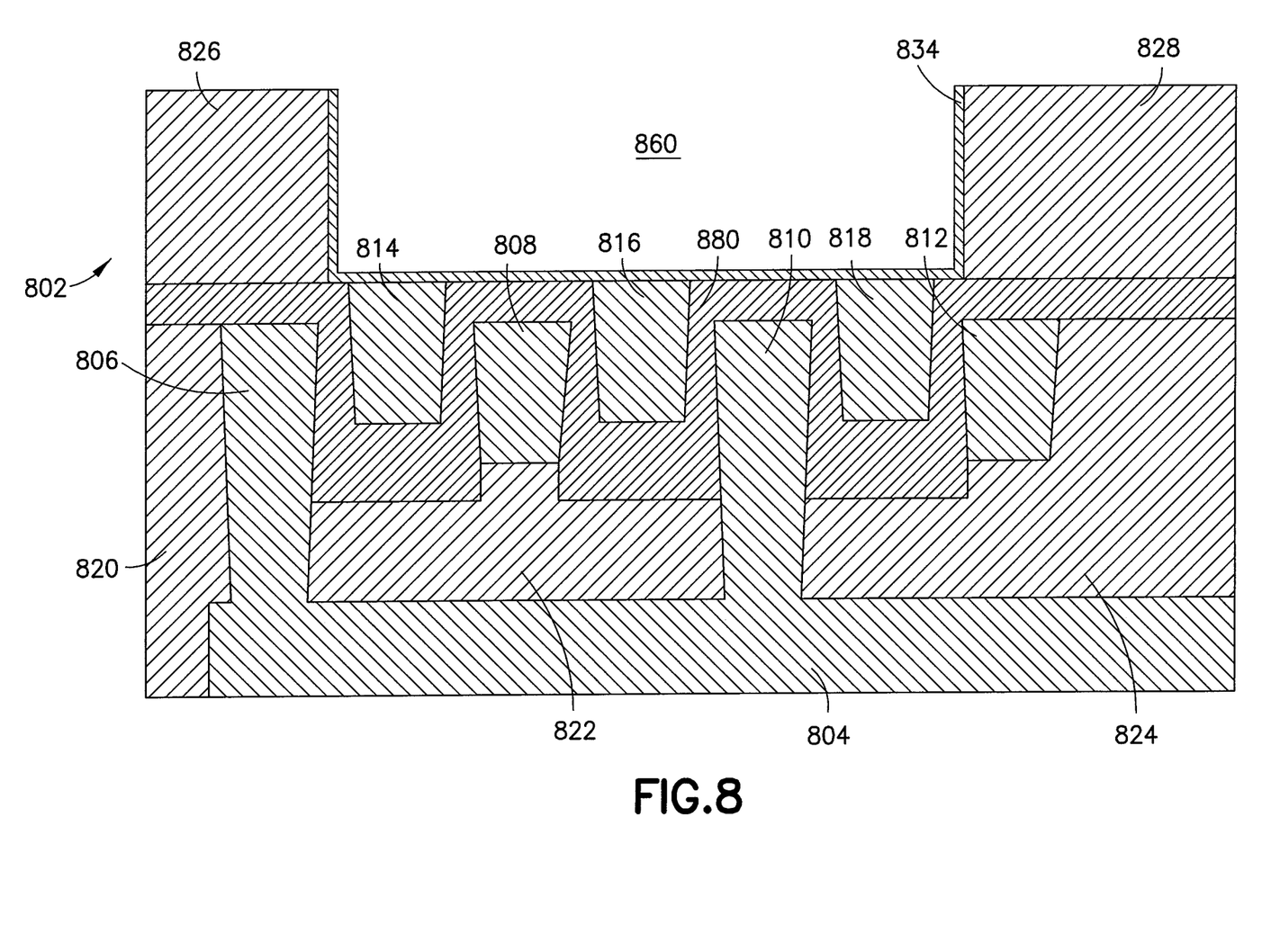
FIG. 8 is a cross-sectional view of the BEOL capacitor created through airgap metallization technique described herein during a seventh stage of manufacture post next level TaN/Ta liner deposition.

FIG. 8 is representation of the stage post next level tantalum nitride/tantalum liner deposition 802. Again, the copper level 804 with prominences 806, 808, 810, and 812 rest within the low-K dielectric material 820, 822, and 824 resting adjacent and covered by high-K insulator 880. Void 860 then has its surroundings coated by the tantalum liner material. Tantalum nitride is the preferred embodiment to use with copper electrodes, but alternate materials could be chosen to correspond to different electrode materials or copper. Alternate materials include titanium, titanium nitride, cobalt, ruthenium or others.

Figure 11:
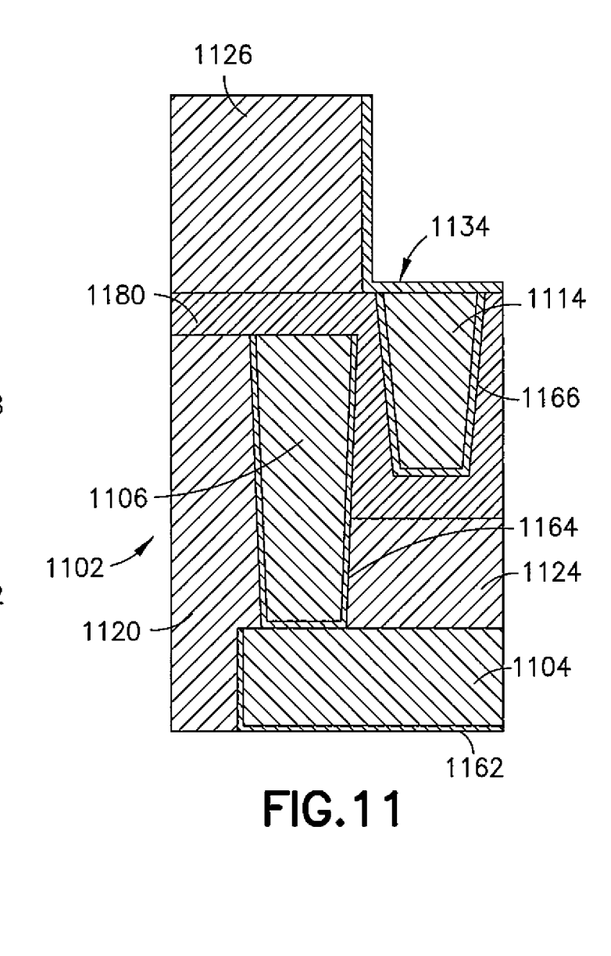
FIG. 11 is a partial cross-sectional view of the BEOL capacitor created through airgap metallization technique described herein during a seventh stage of manufacture post next level TaN/Ta liner deposition illustrating previous TaN/Ta liners that are not typically shown in industry drawings and have been omitted for at least that reason from FIGS. 1 through 10.

Skipping for a moment to FIG. 11 item 1102 shows the true outlines of the tantalum nitride lining material. As can be seen copper base 1104 as well as prominence 1106 and 1114 are partially lined with tantalum in some parts against low-K dielectric material 1120 and 1124 and also against high-K insulator material 1180. FIG. 11 is only shown for completeness because these linings of tantalum or some similar element are not usually depicted in the industry. Thus, since this liner material shown in FIG. 11 behaves as the copper it protects, it is not displayed in current industry drawings reflecting such integrated chip manufacture and so does not appear in FIGS. 1 through 9.

Returning to FIG. 8, void 860 is now lined with tantalum nitride lining 834 and creates a connection with 814, 816, and 818 and has many contact points with high-K insulator material 880.

Figure 9:
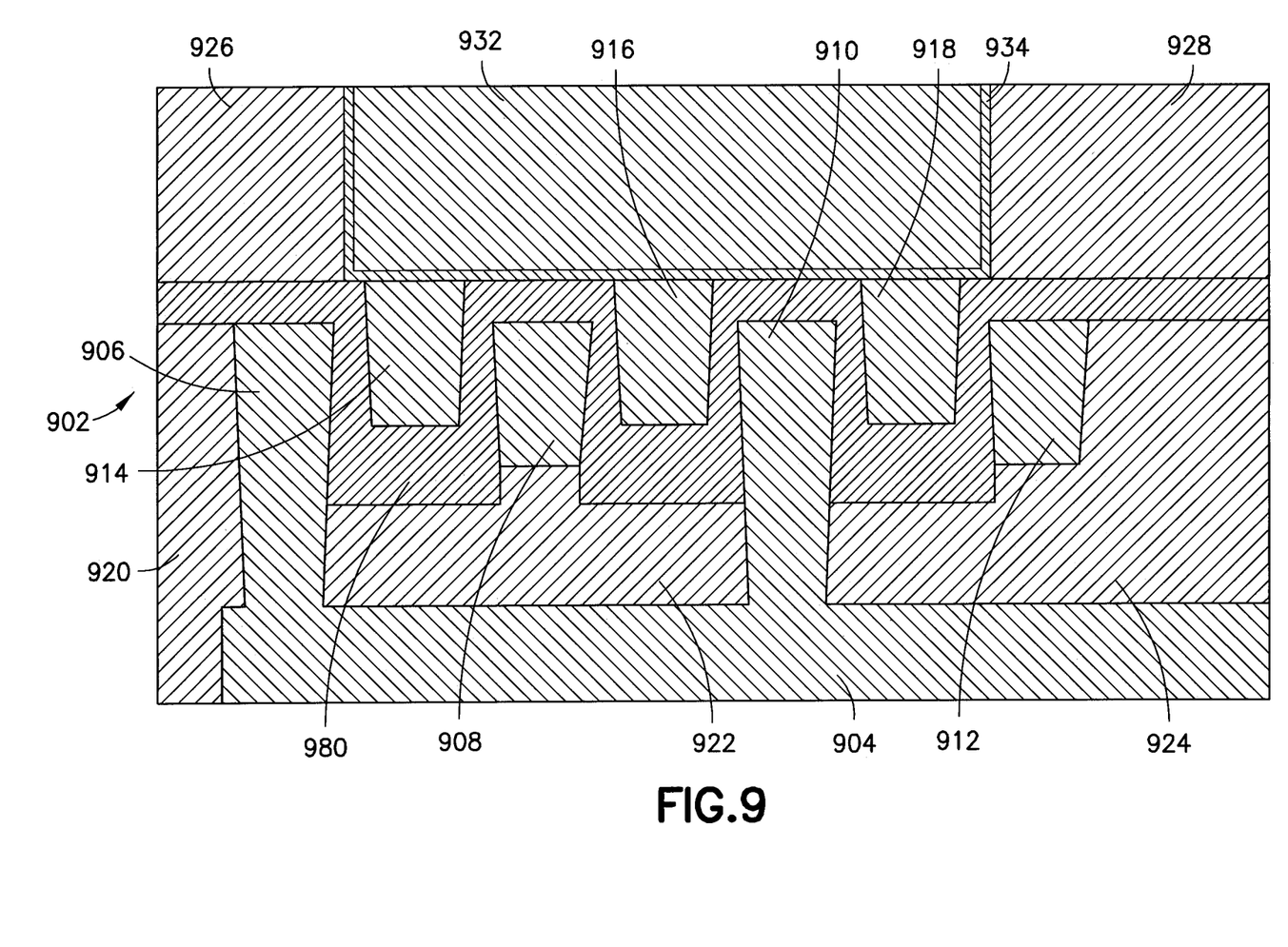
FIG. 9 is a cross-sectional view of the BEOL capacitor created through airgap metallization technique described herein during a last stage of manufacture post next level Cu fill and polish.

FIG. 9 showing item 902 representing the post next level copper fill and polish stage. Here, into what was previously void 860, copper fill 932 is placed. Thus, the capacitor is now complete with its copper bottom electrode 904 and top electrode 932 where the prominences of copper 914, 916, and 918 meet with prominences of copper 906, 908, 910, and 912 intermediated completely without any airgaps or other materials by high-K insulator material 980. Low-K dielectric material 920, 922, 924, 926, and 928 mediate the device. And, as one can see, FIG. 1 and FIG. 9 now represent both the final structure and the end of the process, respectively.

Figure 12:
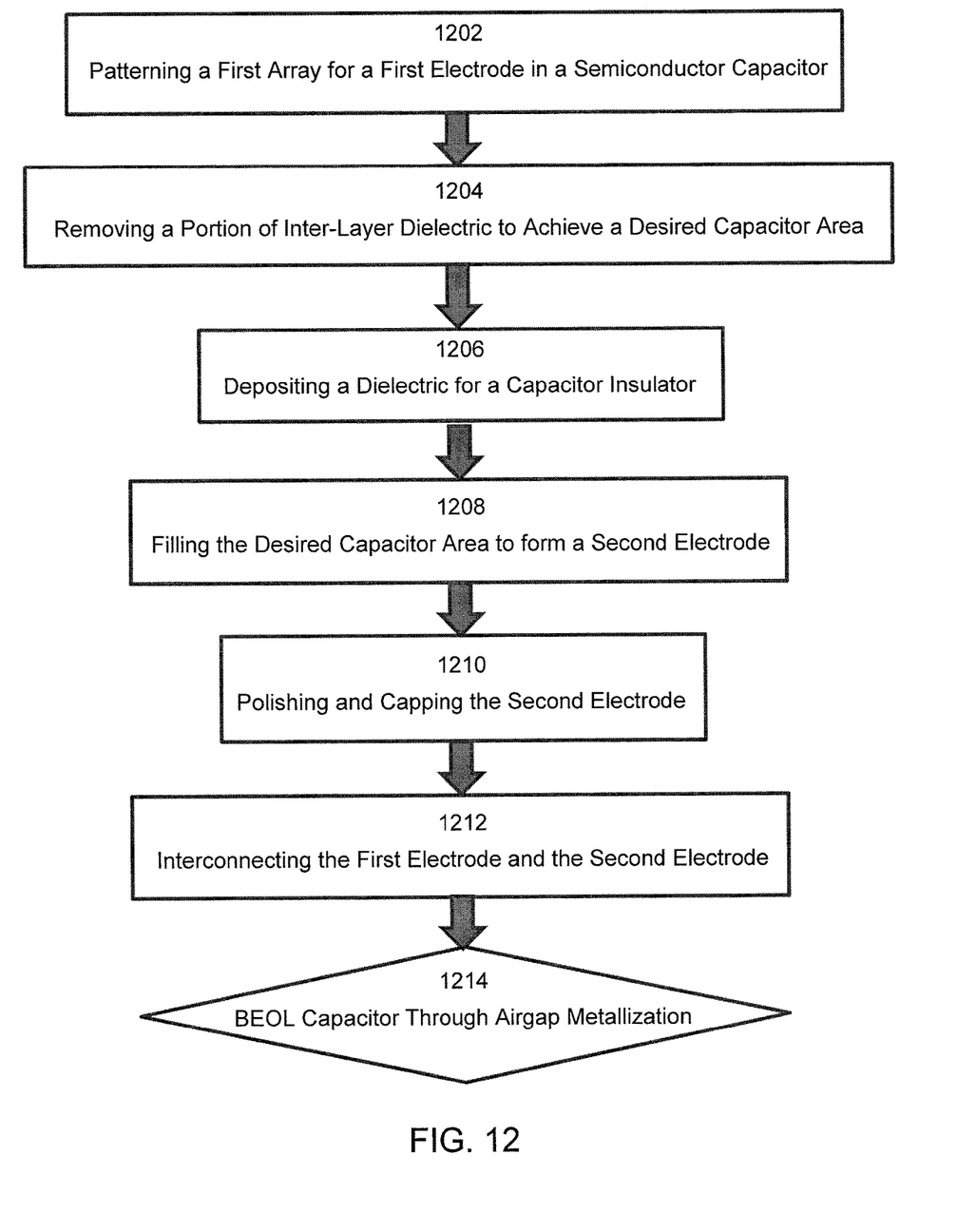
FIG. 12 is a logic flow diagram that illustrates the operation of an exemplary method, a result of execution of computer program instructions embodied on a computer readable memory, and/or interconnected means for performing functions in accordance in accordance with an exemplary embodiment of the manufacture of the BEOL capacitor created through airgap metallization.

FIG. 12 is a logic flow diagram that illustrates the operation of an exemplary method, a result of execution of computer program instructions embodied on a computer readable memory, and/or interconnected means for performing functions in accordance in accordance with an exemplary embodiment of the manufacture of the BEOL capacitor created through airgap metallization.

The method begins with block 1202, which represents the step of patterning a first array for a first electrode in a semiconductor capacitor. The method then proceeds with block 1204, which represents the step of removing a portion of inter-layer dielectric to achieve a desired capacitor area. The method continues with block 1206, which represents the step of depositing a dielectric for a capacitor insulator. The method then next moves onto block 1208, which represents the step of filling the desired capacitor area to form a second electrode. Next, the method proceeds with block 1210, which represents the step of polishing and capping the second electrode. The final step in the method is shown in block 1212, which represents interconnecting the first electrode and the second electrode. The resultant is shown in block 1214, which represents a BEOL capacitor through airgap metallization.

An example of an embodiment, which can be referred to as item 1, is a method that comprises patterning a first array for a first electrode in a semiconductor capacitor; removing a portion of inter-layer dielectric to achieve a desired capacitor area; depositing a dielectric for a capacitor insulator; filling the desired capacitor area to form a second electrode; polishing and capping the second electrode; and interconnecting the first electrode and the second electrode.

An example of a further embodiment, which can be referred to as item 2, is the method of item 1 wherein the first electrode comprises copper or some similarly conductive material.

An example of a further embodiment, which can be referred to as item 3, is the method of item 1, wherein the patterning uses a back end-of-the-line process of record.

An example of a further embodiment, which can be referred to as item 4, is the method of item 1 wherein the removing comprises an airgap processing template.

An example of a further embodiment, which can be referred to as item 5, is the method of item 1 wherein the depositing comprises at least one existing high-K materials chemical vapor deposition process.

An example of a further embodiment, which can be referred to as item 6, is the method of item 1, wherein the second electrode comprises copper or some similarly conductive material.

An example of a further embodiment, which can be referred to as item 7, is the method of item 1, wherein the depositing uses a back end-of-the-line process of record.

An example of a further embodiment, which can be referred to as item 8, is the method of item 1, wherein the polishing and capping uses a back end-of-the-line process of record.

An example of a further embodiment, which can be referred to as item 9, is the method of item 1, wherein the interconnecting uses a back end-of-the-line process of record.

An example of another embodiment of the present invention, which can be referred to as item 10, is a semiconductor capacitor comprising a first array for a first electrode patterned in a semiconductor capacitor process; a desired capacitor area made by removing a portion of inter-layer dielectric; a capacitor insulator made by depositing a dielectric; a second electrode formed by filling the desired capacitor area, the second electrode is polished and capped; and an interconnection of the first electrode and the second electrode.

An example of a further embodiment, which can be referred to as item 11, is the semiconductor capacitor, which can also be referred to as the product or the structure, of item 10, wherein the first electrode comprises copper or some similarly conductive material.

An example of a further embodiment, which can be referred to as item 12, is the semiconductor capacitor, which can also be referred to as the product or the structure, of item 10, wherein the patterning uses a back end-of-the-line process of record. In the process, patterning a first array for a first electrode in a semiconductor capacitor is shown at 1202. Removing a portion of inter-layer dielectric to achieve a desired capacitor area is shown at 1204. Depositing a dielectric for a capacitor insulator is shown at 1206. Filling the desired capacitor area to form a second electrode is shown at 1208. Polishing and capping the second electrode is shown at 1210. Interconnecting the first electrode and the second electrode is shown at 1212. Obtaining the BEOL capacitor through airgap metallization is shown at 1214.

An example of a further embodiment, which can be referred to as item 13, is the semiconductor capacitor, which can also be referred to as the product or the structure, of item 10, wherein the removing comprises an airgap processing template.

An example of a further embodiment, which can be referred to as item 14, is the semiconductor capacitor, which can also be referred to as the product or the structure, of item 10, wherein the depositing comprises at least one existing high-K materials chemical vapor deposition process.

An example of a further embodiment, which can be referred to as item 15, is the semiconductor capacitor, which can also be referred to as the product or the structure, of item 10, wherein the second electrode comprises copper or some similarly conductive material.

An example of a further embodiment, which can be referred to as item 16, is the semiconductor capacitor, which can also be referred to as the product or the structure, of item 10, wherein the depositing uses a back end-of-the-line process of record.

An example of a further embodiment, which can be referred to as item 17, is the semiconductor capacitor, which can also be referred to as the product or the structure, of item 10, wherein the polishing and capping uses a back end-of-the-line process of record.

An example of a further embodiment, which can be referred to as item 18, is the semiconductor capacitor, which can also be referred to as the product or the structure, of item 10, wherein the interconnection uses a back end-of-the-line process of record.

An example of a further embodiment, which can be referred to as item 19, is a semiconductor capacitor comprising a bottom layer, comprising a lower plate or a bottom electrode of the capacitor, composed of a conductor, electrically connected to upward prominences composed of the conductor or another conductor; a low-K layer, above and conjoined to the bottom layer and surrounding the prominences to a specified height, composed of an oxide or a low-K dielectric, where the low-K dielectric has dielectric constant less than silicon dioxide; an isolation layer, above the low-K layer and surrounding the prominences above the specified height, composed of a high-K insulator material, where the insulator has a dielectric constant higher than silicon dioxide, where the material and thickness of the isolation layer can be modulated to control the capacitance; and a cap, comprising an upper plate or a top electrode of the capacitor, composed of a second conductor, electrically connected to downward prominences composed of the second conductor or a second other conductor, where the second conductor can be composed of the conductor and the second other conductor can be composed of the other conductor, where the cap and the downward prominences are isolated from the bottom layer by at least the isolation layer, where the bottom layer and the cap are interconnected.

In another example of an embodiment of the current invention, which can be referred to item 20, a computer program product embodied on a non-transitory computer-readable medium in which a computer program is stored that, when being executed by a computer, would be configured to provide instructions to control or carry out patterning a first array for a first electrode in a semiconductor capacitor; removing a portion of inter-layer dielectric to achieve a desired capacitor area; depositing a dielectric for a capacitor insulator; filling the desired capacitor area to form a second electrode; polishing and capping the second electrode; and interconnecting the first electrode and the second electrode.

In another example of an embodiment of the current invention, which can be referred to item 21, an apparatus comprising: at least one processor; and at least one memory including computer program code, wherein the at least one processor, in response to execution of the computer program code, is configured to cause the apparatus to perform at least the following: patterning a first array for a first electrode in a semiconductor capacitor; removing a portion of inter-layer dielectric to achieve a desired capacitor area; depositing a dielectric for a capacitor insulator; filling the desired capacitor area to form a second electrode; polishing and capping the second electrode; and interconnecting the first electrode and the second electrode.

In another example of an embodiment of the current invention, which can be referred to item 22, an apparatus comprising means to perform at least the following: patterning a first array for a first electrode in a semiconductor capacitor; removing a portion of inter-layer dielectric to achieve a desired capacitor area; depositing a dielectric for a capacitor insulator; filling the desired capacitor area to form a second electrode; polishing and capping the second electrode; and interconnecting the first electrode and the second electrode.

It is also noted herein that while the above describes examples of embodiments of the invention, these descriptions should not be viewed in a limiting sense. Rather, there are several variations and modifications which may be made without departing from the scope of the present invention as defined in the appended claims.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes examples of embodiments of the invention, these descriptions should not be viewed in a limiting sense. Rather, there are several variations and modifications which may be made without departing from the scope of the present invention as defined in the appended claims.

What we claim is:

1. A semiconductor capacitor comprising:
   a first electrode patterned in a semiconductor capacitor process to include a plurality of first prominences each having a first height and interconnected with a plurality of second prominences each having a second height, the first height being different from the second height;
   a low-K layer, above and conjoined to the first electrode and surrounding the first prominences and the second prominences to a specified height, where the low-K layer has a dielectric constant less than silicon dioxide;
   a capacitor insulator comprising a dielectric deposited on the first prominences and on and under the second prominences wherein varying the material and/or thickness of the insulator determines the total capacitance of the structure;
   a second electrode deposited on the capacitor insulator, the second electrode being polished and capped; and
   an interconnection of the first electrode and the second electrode.

2. The semiconductor capacitor of claim 1, wherein the first electrode comprises copper.

3. The semiconductor capacitor of claim 1, wherein the patterning uses a back end-of-the-line process of record.

4. The semiconductor capacitor of claim 1, wherein the dielectric comprises a high-K material deposited using a chemical vapor deposition process.

5. The semiconductor capacitor of claim 1, wherein the second electrode comprises copper.

6. The semiconductor capacitor of claim 1, wherein the dielectric is deposited using a back end-of-the-line process of record.

7. The semiconductor capacitor of claim 1, wherein the polishing and capping uses a back end-of-the-line process of record.

8. The semiconductor capacitor of claim 1, wherein the interconnection uses a back end-of-the-line process of record.

9. A semiconductor capacitor comprising:
- a bottom layer, comprising a lower plate or a bottom electrode of the capacitor, composed of a conductor, electrically connected to a plurality of first upward prominences composed of the conductor or another conductor, the first upward prominences having a first height, and electrically connected to a plurality of second upward prominences composed of the conductor or another conductor, the second upward prominences having a second height that is different from the first height;
- a low-K layer, above and conjoined to the bottom layer and surrounding the prominences to a specified height, where the low-K layer has dielectric constant less than silicon dioxide;
- an isolation layer, above the low-K layer and surrounding the prominences above the specified height, composed of a high-K insulator material,
  - where the insulator has a dielectric constant higher than silicon dioxide,
  - where the material and thickness of the isolation layer determines the capacitance; and
- a cap, comprising an upper plate or a top electrode of the capacitor, composed of a second conductor, electrically connected to downward prominences composed of the second conductor or a second other conductor,
  - where the second conductor is composed of the conductor and the second other conductor is composed of the other conductor,
  - where the cap and the downward prominences are isolated from the bottom layer by at least the isolation layer,
  - where the bottom layer and the cap are interconnected.

* * * * *